(12) United States Patent
Marsanne et al.

(10) Patent No.: US 7,501,704 B2
(45) Date of Patent: Mar. 10, 2009

(54) INTEGRATED CIRCUIT CHIP WITH EXTERNAL PADS AND PROCESS FOR FABRICATING SUCH A CHIP

(75) Inventors: Sébastien Marsanne, Meylan (FR); Olivier Le Briz, Saint-Gervais (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/607,827

(22) Filed: Nov. 30, 2006

(65) Prior Publication Data

US 2007/0132095 A1 Jun. 14, 2007

(30) Foreign Application Priority Data

Dec. 9, 2005 (FR) .................................. 05 12500

(51) Int. Cl.
*H01L 23/48* (2006.01)
(52) U.S. Cl. .......................... 257/734; 257/774; 257/786
(58) Field of Classification Search ................. 257/734, 257/737, 778, 786, 758, 774
See application file for complete search history.

(56) References Cited

U.S. PATENT DOCUMENTS

| | | | | |
|---|---|---|---|---|
| 5,751,065 | A  * | 5/1998 | Chittipeddi et al. | .......... 257/758 |
| 6,028,367 | A  * | 2/2000 | Yu | .............................. 257/780 |
| 6,495,917 | B1 | 12/2002 | Ellis-Monaghan et al. | |
| 6,822,329 | B2 * | 11/2004 | Varrot et al. | ................. 257/758 |
| 6,841,872 | B1 | 1/2005 | Ha et al. | |
| 6,900,541 | B1 * | 5/2005 | Wang et al. | .................. 257/758 |
| 2002/0179991 | A1 | 12/2002 | Varrot et al. | |
| 2003/0167632 | A1 | 9/2003 | Thomas et al. | |
| 2005/0133894 | A1 | 6/2005 | Bohr et al. | |

OTHER PUBLICATIONS

Preliminary French Search Report, FR 05 12500, dated Sep. 21, 2006.

* cited by examiner

*Primary Examiner*—Roy K Potter
(74) *Attorney, Agent, or Firm*—Gardere Wynne Sewell LLP

(57) ABSTRACT

An integrated circuit chip has a dielectric surface layer and, below this layer, internal pads. The chip is fabricated by producing multiplicities of vias made of an electrically conducting material which pass through said surface layer and are positioned respectively above the internal pads. Projecting external contact pads are formed on the surface layer and connected respectively to the multiplicities of vias.

16 Claims, 2 Drawing Sheets

INTEGRATED CIRCUIT CHIP WITH EXTERNAL PADS AND PROCESS FOR FABRICATING SUCH A CHIP

PRIORITY CLAIM

The present application claims priority from French Application for Patent No. 05 12500 filed Dec. 9, 2005, the disclosure of which is hereby incorporated by reference.

BACKGROUND OF THE INVENTION

1. Technical Field of the Invention

The present invention relates to the field of integrated circuit chips equipped with projecting external contact pads.

2. Description of Related Art

Integrated circuit chips equipped with projecting external contact pads are intended in particular to be mounted on boards in such a way that their external contact pads make electrical connections on these boards. To do this, during the mounting operation, the chips are pressed onto boards provided with a dielectric layer having, in suspension, particles made of an electrically conducting material, in such a way that the particles located between the boards and the end or front faces of the external contact pads establish the electrical connections.

Currently, starting from a chip having a lower layer on which internal pads are formed and a surface layer that covers the latter and has surface bumps in the regions of these internal pads, apertures are produced in the surface layer, above the internal pads, and the projecting external contact pads are produced by a deposition process, whereby an electrically conducting material is grown in the apertures of the surface layer and in apertures of a temporary mask, which are wider than the apertures in the surface layer. As a result, the end faces of the external contact pads obtained have a central recessed portion and a peripheral rim corresponding to the rim of the surface layer surrounding the corresponding aperture made in this layer.

Such an arrangement results in a weakening of the surface layer around the external contact pads and a risk of cracks appearing during the aforementioned mounting operation, which must be carried out using relatively high pressures owing to the existence of said recessed portions, these cracks being favorable to the occurrence of internal corrosion of the chip. Furthermore, since the internal pads are in general made of aluminum and the external contact pads are in general made of gold, there is a risk of electrochemical reactions liable, by swelling of the material, to degrade the electrical connections and further increase the risk of cracks appearing.

SUMMARY OF THE INVENTION

An integrated circuit chip has a dielectric surface layer and, beneath this layer, internal pads. Multiplicities of vias made of an electrically conducting material are provided passing through said surface layer and made respectively above said internal pads. Projecting external contact pads are formed on said surface layer and connected respectively to said multiplicities of vias.

Said multiplicities of vias are preferably provided beneath flat front faces and said projecting external contact pads are preferably formed on these flat front faces.

Said external contact pads preferably have flat front faces.

Said internal pads are made of aluminum (Al), said vias are made of tungsten (W) and said external contact pads are made of gold (Au).

A process for producing projecting external contact pads on an integrated circuit chip having a dielectric surface layer and, beneath this layer, internal pads, comprises: producing multiplicities of holes in said surface layer respectively above the internal pads; filling these holes with an electrically conducting material so as to form vias; depositing a mask layer on said surface layer; producing apertures through said mask layer above the multiplicities of holes; filling said apertures with an electrically conducting material so as to form external contact pads; and removing or eliminating said mask layer in such a way that these external contact pads project above said surface layer and are connected to said internal pads by said vias.

The process preferably comprises producing said apertures above flat portions of said surface layer.

Said apertures are preferably filled by deposition, whereby material is grown in these apertures up to substantially their edge.

The process preferably comprises depositing at least one intermediate layer made of an electrically conducting material before said mask layer is deposited, and removing or eliminating this intermediate layer around said projecting external contact pads after or during the removal or elimination of said mask layer.

In an embodiment, an integrated circuit chip comprises a passivation layer, an internal metal pad on a top surface of the passivation layer, a conformal dielectric layer covering the internal metal pad and passivation layer, the dielectric layer including a bump region at a location of the internal metal pad, at least one electrical via formed in the dielectric layer through the bump region, and a parallelepipedal shaped external contact pad extending from a top surface of the dielectric layer at the location of the bump region and in electrical contact with the at least one via.

In an embodiment, a process comprises forming an internal metal pad on a top surface of a passivation layer, providing a conformal dielectric layer covering the internal metal pad and passivation layer, the dielectric layer including a bump region at a location of the internal metal pad, forming at least one electrical via in the dielectric layer through the bump region, and forming a parallelepipedal shaped external contact pad extending from a top surface of the dielectric layer at the location of the bump region and in electrical contact with the at least one via.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE PREFERRED EMBODIMENTS

Figure 1:
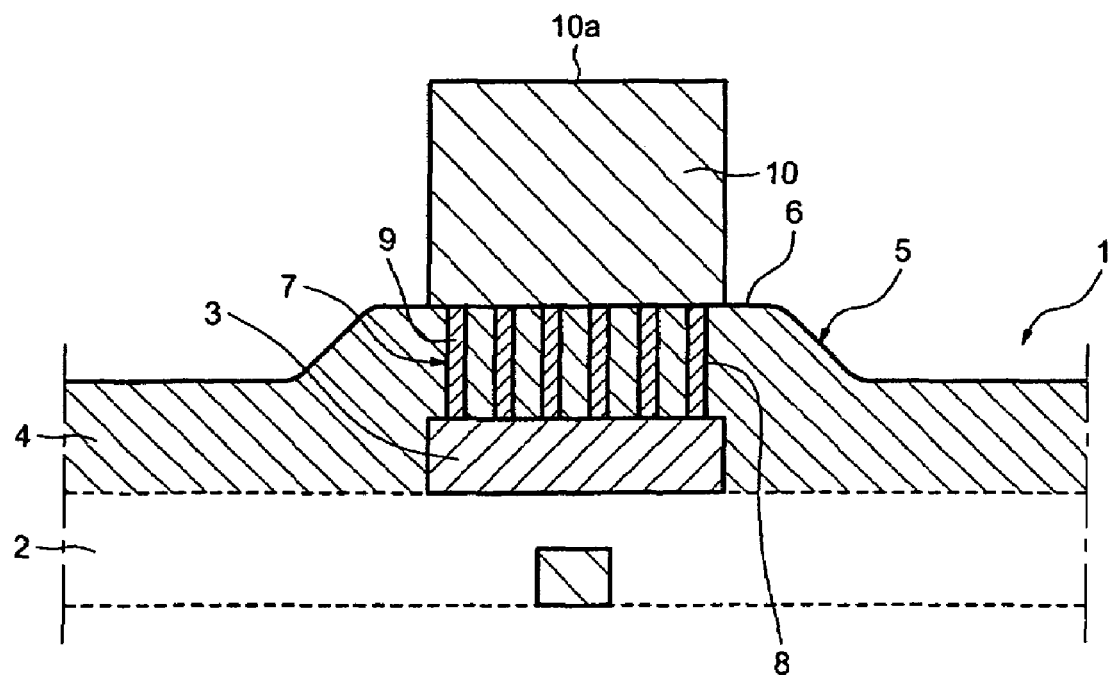
FIG. 1 shows a partial section through an integrated circuit chip according to the invention.

Referring to FIG. 1, it may be seen that an integrated circuit chip 1 is made up of several successive layers, which includes a final layer 2 on which are formed spaced-apart metal internal pads 3 and, on this final layer 2, a dielectric surface layer 4 called a passivation layer, this surface layer 4 having bumps 5 that envelop, via the top, the internal pads 3 and have a flat front face 6. Of course, the internal pads 3 are selectively connected to the integrated circuits.

Provided in the surface layer 4 are multiplicities 7 of holes 8 formed respectively above the internal pads 3, the holes 8 of each multiplicity 7 being preferably distributed in the form of regular matrices below the flat front face 6.

Vias 9 made of an electrically conducting material are formed in the holes 8.

Formed on the flat front faces 6 of the bumps 5 of the surface layer 4 are projecting external contact pads 10 made of an electrically conducting material, for example of parallelepipedal shape, in such a way that these external contact pads 10 are respectively connected electrically to the internal pads by means of the vias 9.

Between the material constituting the external contact pads 10 and the front face 6 of the bump 5 there may be provided at least one intermediate layer made of an electrically conducting material, for example in order to obtain good bonding of the external contact pads 10 to the surface layer 4.

To fabricate the above structure, the processes commonly used in the field of microelectronics may be used, especially etching, deposition, heat treatment and cleaning, these being well known to those skilled in the art. In particular, the following procedure may be carried out.

Figure 2:
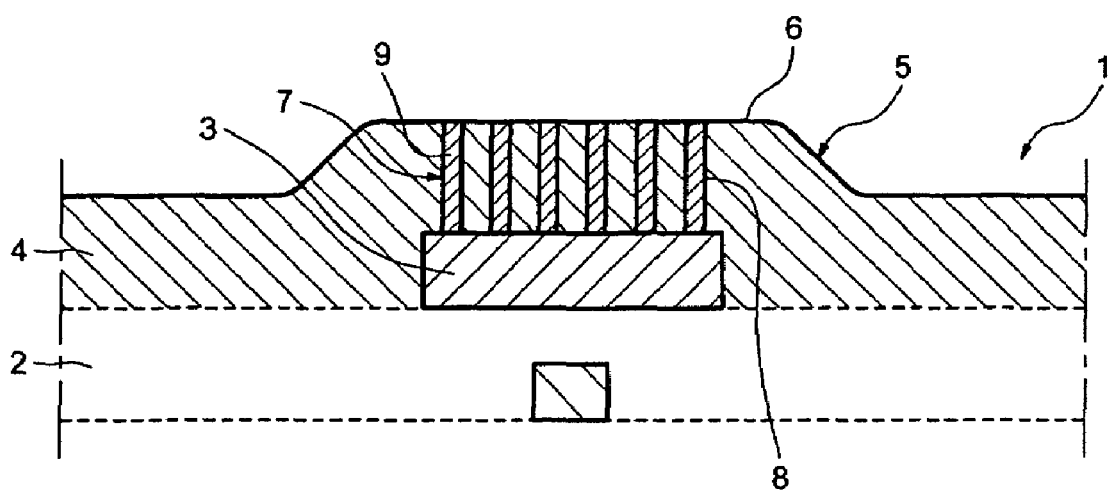
FIG. 2 shows the chip of FIG. 1 during fabrication.

As shown in FIG. 2, holes 8 are produced in a chip 1 having internal pads 3 made of aluminum (Al). These holes 8 are then filled with tungsten (W) so as to form the vias 9 by known processes.

Figure 3:
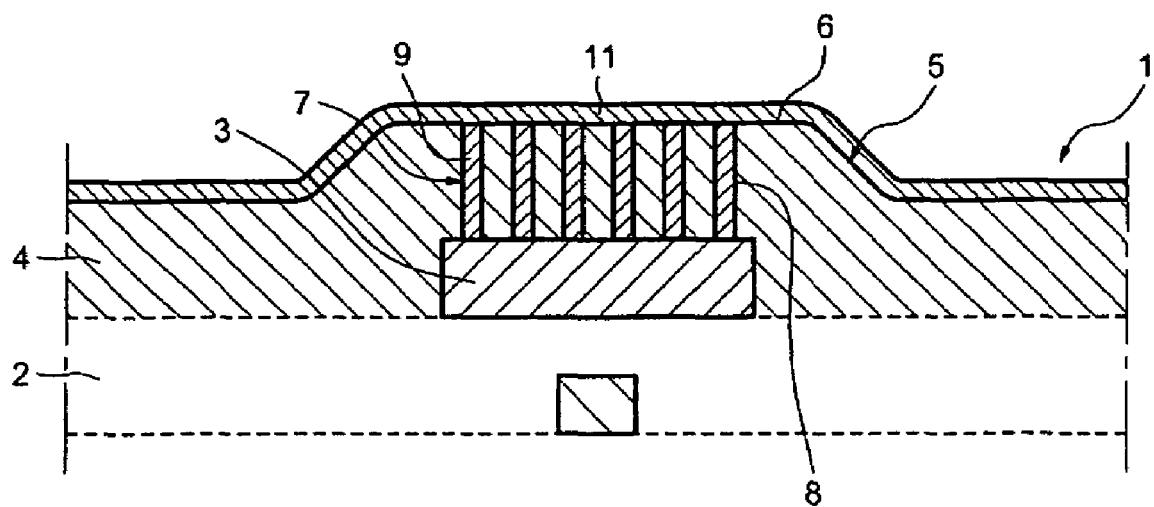
FIG. 3 shows the chip of FIG. 1 in a subsequent fabrication step.

As shown in FIG. 3, the process continues with the deposition of an intermediate layer 11 made of gold (Au) on the surface layer 4, possibly interposing a bonding layer (UBM).

Figure 4:
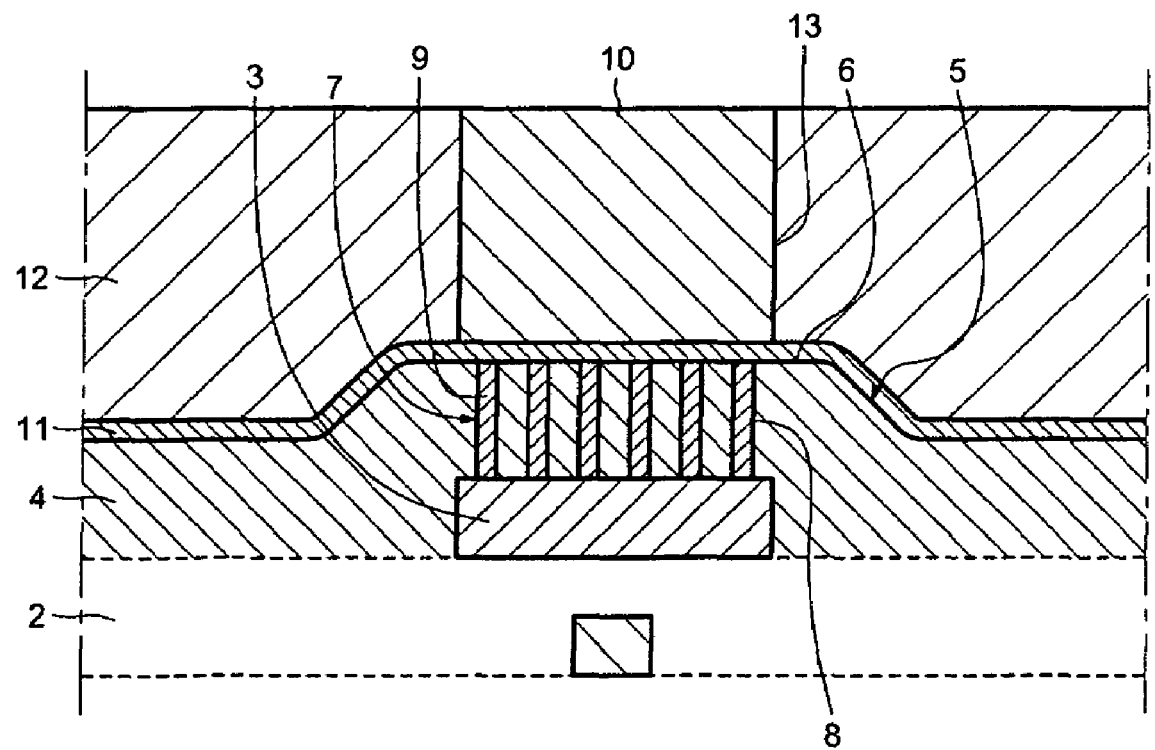
FIG. 4 shows the chip of FIG. 1 in a subsequent fabrication step.

As shown in FIG. 4, a mask layer 12 is formed on the intermediate layer 11 and apertures 13, corresponding to the pads 10 to be produced, are produced in said mask layer. These apertures 12 extend over a portion of the front face 6 of the bumps 5 and above the vias 9.

Gold (Au) is then deposited by local growth in the apertures 13 of the material deposited on the intermediate layer 11, preferably up to substantially the edge of these apertures 13.

Finally, all the layers formed above the surface of the surface layer 4 and around the external contact pads 10 are removed and cleaned.

The chip 1 thus produced has in particular the following advantages.

Since the external contact pads 10 are formed on a flat surface, they have a flat front face 10a. Consequently, the electrical connections by means of particles interposed between this front face 10a and a board may be obtained using lower pressures.

The holes 8 made in the surface layer 4 have little influence on the mechanical strength of this layer and the combination of the internal pads 3, the surface layer 4, the vias 9 and the external pads 10 constitutes a strong structure. Consequently, the risks of cracks appearing are reduced. In addition, it is unnecessary to provide reinforcements beneath the internal pads 3 so that the space beneath these pads, useful for providing circuits or components therein, may be independent of the position of these pads.

The interposition of tungsten vias 8 between the aluminum internal pad 3 and the gold external pads 10 reduces the risk of electrochemical reactions and of swelling, which could cause cracks.

Of course, metals other than those mentioned above could be used.

The present invention is not limited to the examples described above. Alternative embodiments are possible without departing from the scope of the appended claims.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An integrated circuit chip, comprising:
   a top-most circuit layer;
   one or more internal pads formed on a top surface of the top-most circuit layer;
   a conformal dielectric passivation layer covering the internal pads and top-most circuit layer;
   multiplicities of vias made of an electrically conducting material passing through said conformal dielectric passivation layer and made respectively above each of said internal pads; and
   one or more external contact pads formed on a top surface of said conformal dielectric passivation layer over and connected respectively to said multiplicities of vias, wherein the external contact pads project above the top surface of said conformal dielectric passivation layer such that sides of the external contact pads are exposed.

2. The chip according to claim 1, wherein said multiplicities of vias are provided beneath flat front faces of bumps formed by the conformal dielectric passivation layer over each internal pad and wherein said projecting external contact pads are formed on top of these flat front faces.

3. The chip according to claim 1, wherein said external contact pads have flat front faces on top surfaces thereof.

4. The chip according to claim 1, wherein said internal pads are made of aluminum, said vias are made of tungsten and said external contact pads are made of gold.

5. An integrated circuit chip, comprising:
   a top-most circuit layer;
   an internal metal pad on a top surface of the top-most circuit layer;
   a conformal dielectric layer covering the internal metal pad and top-most circuit layer, the dielectric layer including a bump region at a location of the internal metal pad;
   at least one electrical via formed in the conformal dielectric layer through the bump region; and
   a parallelepipedal shaped external contact pad upwardly extending from a top surface of the conformal dielectric layer at the location of the bump region and in electrical contact with the at least one via, wherein sides of the external contact pad are exposed above the top surface of the conformal dielectric layer.

6. The chip of claim 5 wherein the external contact pad has a substantially flat top surface.

7. The chip of claim 5 wherein the at least one electrical via comprises a multiplicity of electrical vias arranged in matrix format.

8. The chip of claim 5, wherein the internal metal pad is made of aluminum, the via is made of tungsten and the external contact pad is made of gold.

9. An integrated circuit chip, comprising:
   an internal metal pad formed on a top surface of a integrated circuit;
   a conformal dielectric layer covering the internal metal pad and top surface, the dielectric layer including a bump region at a location of the internal metal pad;

at least one electrical via formed in the conformal dielectric layer through the bump region; and an external contact pad formed on a top surface of the conformal dielectric layer at the location of the bump region and in electrical contact with the at least one via, the external contact pad projecting above the top surface of the conformal dielectric layer and having exposed sides.

10. The chip of claim 9 wherein the external contact pad has a substantially flat top surface.

11. The chip of claim 9 wherein the at least one electrical via comprises a multiplicity of electrical vias arranged in matrix format.

12. The chip of claim 9, wherein the internal metal pad is made of aluminum, the via is made of tungsten and the external contact pad is made of gold.

13. An integrated circuit chip, comprising:

an internal pad formed on a top surface of an integrated circuit;

a dielectric passivation layer covering the internal pad and top surface of the integrated circuit;

vias made of an electrically conducting material passing through said dielectric passivation layer above said internal pad; and an external contact pad formed on a top surface of said dielectric passivation layer over and connected to said vias, the external contact pad projecting above the top surface of said dielectric passivation layer so as to expose sides of the external contact pad.

14. The chip according to claim 13, wherein said vias are provided beneath a flat front face of a conformal bump formed by the dielectric passivation layer over the internal pad and wherein said projecting external contact pad is formed on top of the flat front face.

15. The chip according to claim 13, wherein said external contact pad has a flat front face on a top surface thereof.

16. The chip according to claim 13, wherein said internal pad is made of aluminum, said vias are made of tungsten and said external contact pad is made of gold.

* * * * *